(12) United States Patent
Demange

(10) Patent No.: US 8,995,101 B2
(45) Date of Patent: Mar. 31, 2015

(54) ELECTROSTATIC DISCHARGE PROTECTION CIRCUIT

(71) Applicant: STMicroelectronics (Rousset) SAS, Rousset (FR)

(72) Inventor: Nicolas Demange, Saint Maximum la Sainte Baume (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 100 days.

(21) Appl. No.: 13/779,464

(22) Filed: Feb. 27, 2013

(65) Prior Publication Data

US 2013/0222954 A1   Aug. 29, 2013

(30) Foreign Application Priority Data

Feb. 29, 2012   (FR) ...................... 12 51853

(51) Int. Cl.
*H02H 9/04* (2006.01)
*H01L 27/02* (2006.01)

(52) U.S. Cl.
CPC ............... *H02H 9/046* (2013.01); *H02H 9/043* (2013.01); *H02H 9/041* (2013.01); *H01L 27/0285* (2013.01)
USPC ........................................... 361/56; 361/91.1

(58) Field of Classification Search
CPC ........ H02H 9/046; H02H 9/043; H02H 9/041
USPC ................................................... 361/56, 91.1
See application file for complete search history.

(56) References Cited

U.S. PATENT DOCUMENTS

| 5,825,601 | A | 10/1998 | Statz et al. |
| 5,946,177 | A | 8/1999 | Miller et al. |
| 6,147,538 | A * | 11/2000 | Andresen et al. ............. 327/309 |
| 6,522,511 | B1 | 2/2003 | John et al. |
| 6,549,061 | B2 * | 4/2003 | Voldman et al. ............... 327/483 |
| 7,064,942 | B2 * | 6/2006 | Ker et al. ......................... 361/56 |
| 8,730,625 | B2 * | 5/2014 | Stockinger ...................... 361/56 |
| 2004/0027742 | A1 | 2/2004 | Miller et al. |
| 2010/0027175 | A1 | 2/2010 | Negoi |

* cited by examiner

*Primary Examiner* — Zeev V Kitov
(74) *Attorney, Agent, or Firm* — Seed IP Law Group PLLC

(57) ABSTRACT

An electrostatic discharge protection circuit is coupled to a power supply rail and a ground supply rail of an integrated circuit and includes at least one shunt configured to couple the supply rails and a trigger configured to supply on an output a shunt control voltage to a control terminal of the shunt to set the shunt in a coupling state when an ESD event is sensed on one of the supply rails. The protection circuit further comprises a voltage booster arranged between the output of the trigger and the control terminal of the shunt to boost the shunt control voltage.

16 Claims, 6 Drawing Sheets

ELECTROSTATIC DISCHARGE PROTECTION CIRCUIT

BACKGROUND

1. Technical Field

The present disclosure relates to an electrostatic discharge protection circuit for an integrated circuit, and to an integrated circuit comprising such a protection circuit.

2. Description of the Related Art

An integrated circuit (IC) comprising sensitive internal circuitry may be subjected to an Electrostatic Discharge (ESD) event consisting of a very high voltage applied to pins or pads of the circuit. Such an event may damage the circuitry and occur during the manufacture, assembly, testing, or normal handling and operation of the integrated circuit or of a product in which the integrated circuit is incorporated. Clamp circuits or "shunts", such as a large MOSFET transistor, are therefore commonly provided as part of an ESD protection circuit to couple power and ground supply rails of the IC in response to a detection of an ESD event. The high voltage received is thereby dissipated through the shunt and the sensitive circuitry is protected from damage.

FIG. 1 shows a conventional integrated circuit IC comprising an ESD protection circuit EC along the lines of the circuit disclosed by U.S. Pat. No. 5,946,177. The integrated circuit comprises a voltage pad PV coupled to a power supply rail PSR, a ground pad PG coupled to a ground supply rail GSR, and an input/output pad P0. The integrated circuit IC further comprises internal circuitry CT and an ESD protection circuit EC, both linked to the supply rails PSR, GSR.

The ESD protection circuit EC comprises an input 1, a trigger 2, a trigger output node N3, a delay 3, and a shunt transistor TN1 configured to couple the rails PSR, GSR of the integrated circuit IC. Input 1 comprises an input node N1 and diodes D1, D2. Input node N1 is coupled to the pad P0 and to the supply rails PSR, GSR via diodes D1, D2 respectively. As diodes D1, D2 are on the ESD discharge path, they are relatively large.

The trigger 2 comprises a resistor R1 and a capacitor C1 in series forming an RC transient filter, a detection node N2, and a PMOS transistor TP1. Resistor R1 has one terminal coupled to the power supply rail PSR and one terminal coupled to node N2. The capacitor C1 has one terminal coupled to node N2 and one terminal coupled to the ground supply rail GSR. Transistor TP1 has a gate terminal G driven by node N2, a source terminal S coupled to the power supply rail PSR, and a drain terminal D coupled to the trigger output node N3.

The delay 3 comprises a resistor R2 and a capacitor C2. Resistor R2 and capacitor C2 each have one terminal coupled to node N3 and one terminal coupled to the ground supply rail GSR. Capacitor C2 may be a gate-body parasitic capacitance of transistor TN1 or a physical capacitor. Finally, the shunt transistor TN1 has a control terminal (gate terminal G) driven by node N3, a drain terminal D coupled to the power supply rail PSR, and a source terminal S coupled to the ground rail GSR.

Circuit EC provides protection from positive ESD events applied between pad PV and a grounded pad PG, negative ESD events applied between pad PG and a grounded pad PV, as well as ESD events between pad P0 and either of pads PV, PG.

FIG. 2 shows voltages V with respect to time t at various points of the ESD protection circuit EC during an ESD event. Five voltages VP, VG, V1, V2, and V3 are shown in FIG. 2, each corresponding to the voltage at a respective part of the circuit of FIG. 1. Voltage VP is the voltage present on the power supply rail PSR, voltage VG is the voltage present on the ground supply rail GSR, and voltages V1, V2, V3 are the voltages present at nodes N1, N2, N3 respectively.

At a time t1, an ESD event occurs, for example by applying test probes between pad P0 and the ground pad PG. Voltage V1 present at the pad P0 increases rapidly. Voltage VP present on the power supply rail also increases, but to a peak voltage value much less than that of voltage V1 due to the voltage drop across diode D1 and due to parasitic resistances (not shown) present in the supply rails. Voltage VG on the ground supply rail increases slightly, but is maintained relatively low by ground pad PG, which is connected to ground.

Voltage V2 at node N2 is initially held low, at a voltage value less than that of the power supply rail. Consequently, transistor TP1 is in a conducting state. Node N3 is thus coupled to the power supply rail PSR, and voltage V3 increases towards voltage VP, setting the shunt transistor TN1 in a coupling state. The supply rails GSR, PSR are coupled, and the voltage VP on the power supply rail decreases.

Voltage V2 rises with a delay time set by the RC time constant determined by resistor R1 and capacitor C1. Eventually, voltage V2 passes the threshold voltage of transistor TP1, and transistor TP1 is set in a blocked state, isolating node N3. The delay 3 maintains transistor TN1 in a conductive state for the entire duration of the ESD event, which may be 500 nS or more. The voltage V3 at node N3 decreases with a value determined by resistor R2 and capacitor C2.

In normal operation of the integrated circuit IC, voltage V2 at node N2 is at a high voltage value, keeping transistor TP1 in a blocked state. A relatively constant voltage applied on the power supply rail PSR and its slight fluctuations are not detected by the trigger 2 and thus do not launch the operation of the protection circuit EC. Furthermore, resistor R2 keeps voltage V3 at node N3 at zero, such that the shunt transistor TN1 is maintained in a blocked state. Consequently, the ESD protection circuit EC does not interfere with the operation of the integrated circuit IC and the internal circuitry CT.

BRIEF SUMMARY

Embodiments relate to an electrostatic discharge protection circuit configured to be coupled to a power supply rail and a ground supply rail of an integrated circuit and comprising at least one shunt configured to couple the supply rails, and a trigger configured to supply on an output a shunt control voltage to a control terminal of the shunt to set the shunt in a coupling state when an ESD event is sensed on one of the supply rails, and wherein the circuit further comprises a voltage booster arranged between the output of the trigger and the control terminal of the shunt to boost the shunt control voltage.

According to one embodiment, the voltage booster is a level-shifter circuit, receiving a high electrostatic discharge voltage on at least one power input.

According to one embodiment, the voltage booster is configured to receive at least two high electrostatic discharge voltages on power inputs, and the circuit comprises a diode arranged between each power input of the voltage booster and a point of application of the high voltage.

According to one embodiment, the circuit further comprises a first diode arranged between the output of the voltage booster and the control terminal of the shunt.

According to one embodiment, the circuit further comprises a second diode arranged between the output of the trigger and an input of the voltage booster.

According to one embodiment, the circuit further comprises a resistor with one terminal coupled to the ground supply rail and one terminal coupled to a control terminal of the shunt.

Embodiments also relate to an integrated circuit comprising internal circuitry to be protected from electrostatic discharge, power and ground supply rails, at least one pad, and an electrostatic discharge protection circuit.

According to one embodiment, at least one pad is coupled to the voltage booster such that a high electrostatic discharge voltage received at the pad electrically powers the voltage booster.

Embodiments also relate to a semiconductor chip comprising an integrated circuit according to one embodiment.

Embodiments also relate to a device comprising a semiconductor chip.

Embodiments also relate to a method of protecting an integrated circuit comprising an electrostatic discharge protection circuit from an electrostatic discharge event, comprising the steps of receiving a high voltage at some point of the protection circuit, detecting that the high voltage is an electrostatic discharge event voltage, triggering a shunt device to couple a power supply rail and a ground supply rail of the integrated circuit to discharge the high voltage, and boosting a shunt control voltage triggering the shunt device to a higher voltage.

According to one embodiment, the method further comprises the steps of powering a voltage booster with the electrostatic discharge event voltage, and level-shifting the shunt control voltage to a higher voltage level.

BRIEF DESCRIPTION OF THE SEVERAL VIEWS OF THE DRAWINGS

Embodiments will now be described in connection with, but not limited to, the appended drawings in which.

DETAILED DESCRIPTION

Figure 1:
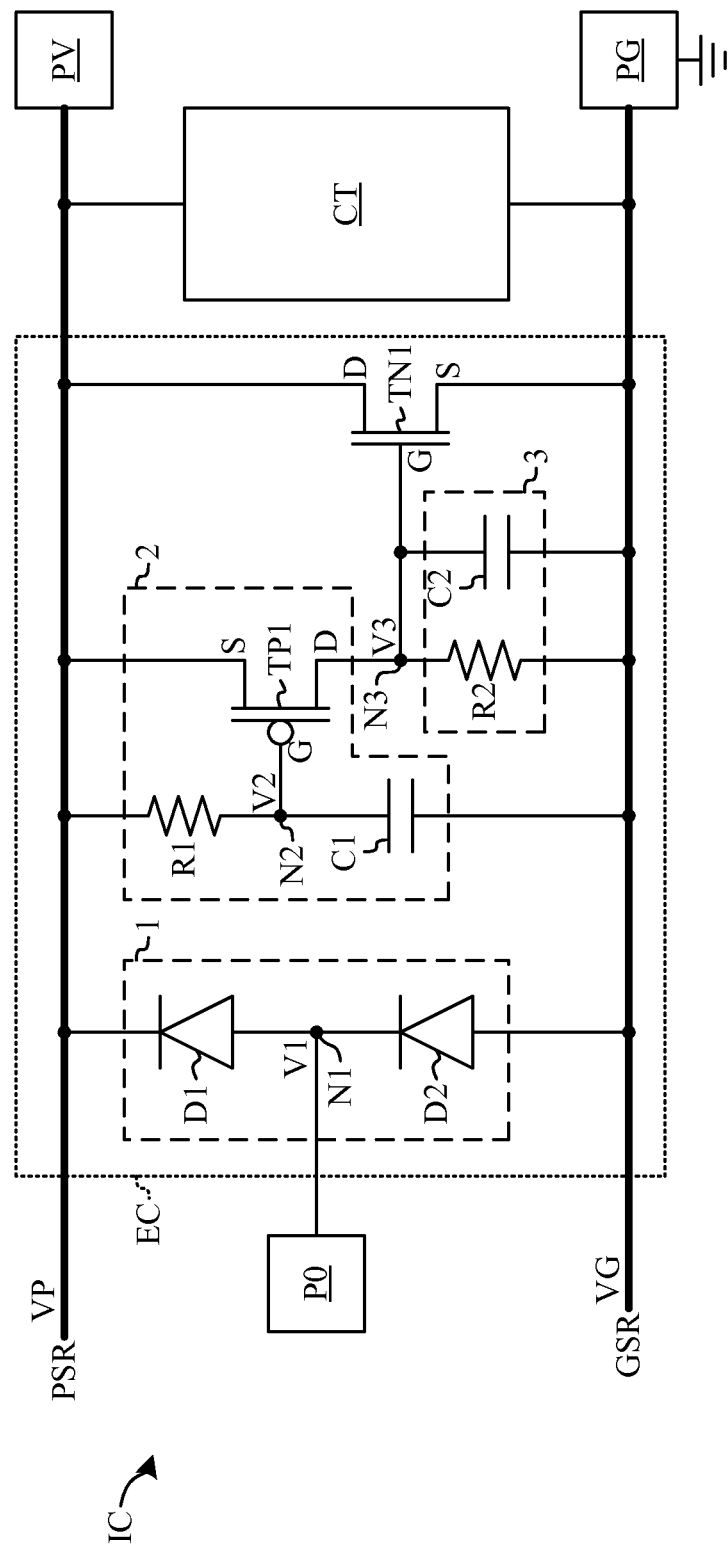
FIG. 1, previously described, shows an integrated circuit comprising a conventional ESD protection circuit, FIG. 2, previously described, shows voltages versus time at various points of the ESD protection circuit of FIG. 1.

The performance of the protection circuit EC of FIG. 1 is largely dependent on the layout of the integrated circuit IC. For example, the pads P0, PV, PG and the inputs 1 are generally grouped together in one region of the integrated circuit, such as around the periphery. Thus, though shown as being adjacent in FIG. 1, the input 1, the trigger 2, and the shunt TN1 may be distanced from each other, such that the parasitic resistance between the input 1 and trigger 2, and between the output node N3 of the trigger 2 and the control terminal (gate G) of the shunt TN1, are very large. The voltage drop across these parasitic resistances reduces the voltage present at the control terminal of the shunt transistor TN 1. As a result, the transistor TN 1 may not reach a full "on" condition, and the clamp current between the power supply rail PSR and the ground supply rail GSR may be reduced.

It may therefore be desired to provide an electrostatic discharge protection circuit with an increased clamp current that is not dependent on the layout.

Figure 3:
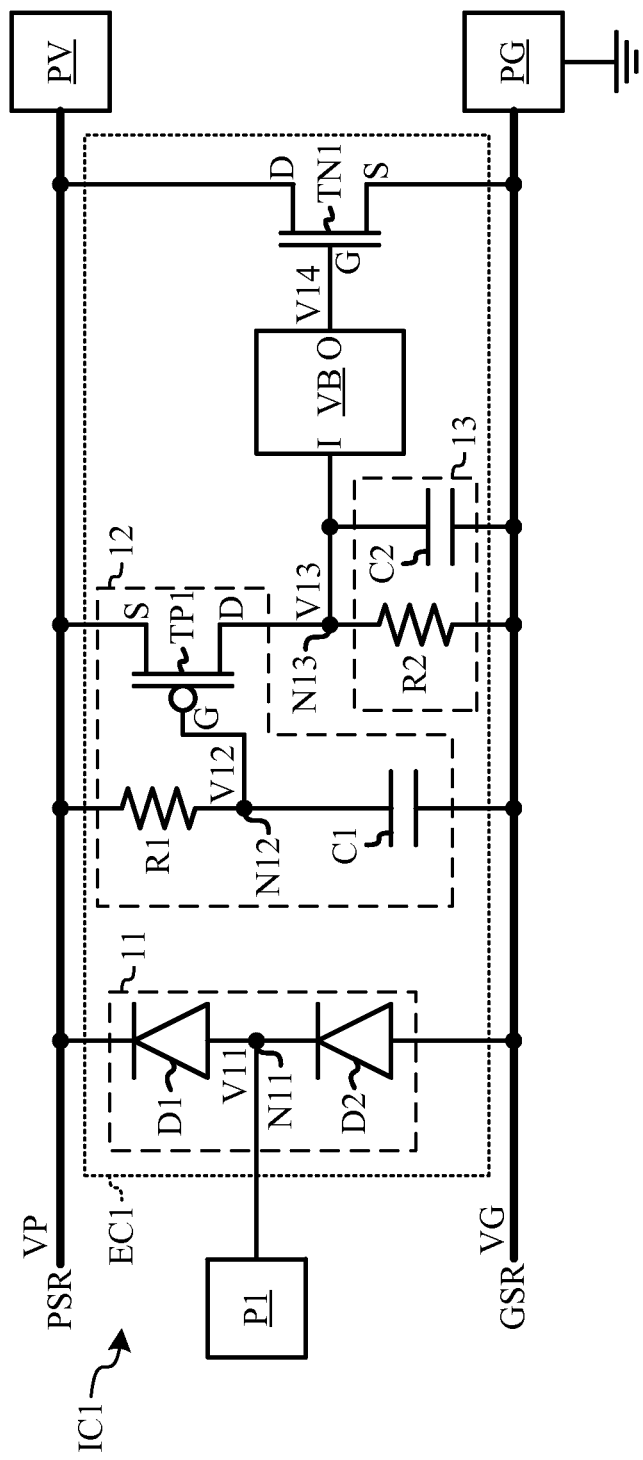
FIG. 3 shows an integrated circuit comprising an ESD protection circuit according to one embodiment.

FIG. 3 shows an integrated circuit IC1 comprising an ESD protection circuit EC1 according to an embodiment of the disclosure. Integrated circuit IC1 comprises a voltage pad PV coupled to a power supply rail PSR, a ground pad PG coupled to a ground supply rail GSR, and an input/output pad P1. The integrated circuit IC further comprises internal circuitry (not shown in FIG. 3) and the ESD protection circuit EC1, both linked to the rails PSR, GSR.

The internal circuitry may be any type of conventional circuitry for which it is desired to provide protection from electrostatic discharge ESD events, such as a memory array, a microprocessor, etc. It will not be discussed in further detail.

The ESD protection circuit EC1 comprises an input 11, a trigger 12, a trigger output node N13, a delay 13, and a shunt transistor TN1 coupling the rails. Additionally, a voltage booster VB is arranged between the output (N13) of the trigger 12 and the control terminal (gate terminal G) of the shunt transistor TN1.

The input 11 comprises an input node N11, a diode D1, and a diode D2. Input node N11 is coupled to the pad P1, to the cathode of diode D1 (the anode of which is coupled to the power supply rail PSR), and to the anode of diode D2 (the cathode of which is coupled to the ground supply rail GSR).

The trigger 12 comprises a resistor R1 and a capacitor C1 in series forming an RC transient filter, a detection node N12, and a PMOS transistor TP1. Resistor R1 has one terminal coupled to the power supply rail PSR and one terminal coupled to node N12. The capacitor C1 has one terminal coupled to node N12 and one terminal coupled to the ground supply rail GSR. Transistor TP1 has a gate terminal G driven by node N12, a source terminal S coupled to the power supply rail PSR, and a drain terminal D coupled to the trigger output node N13.

The delay 13 comprises a resistor R2 and a capacitor C2. Resistor R2 and capacitor C2 each have one terminal coupled to node N13 and one terminal coupled to the ground supply rail GSR. Capacitor C2 may be a gate-body parasitic capacitance of transistor TN1 or a physical capacitor.

The voltage booster VB has an input I coupled to node N13, and an output O coupled to the control terminal (gate terminal G) of transistor TN1. Transistor TN1 further has a drain terminal D coupled to the power supply rail PSR, and a source terminal S coupled to the ground rail GSR.

Voltage VP is the voltage present on the power supply rail PSR, voltage VG is the voltage present on the ground supply rail GSR, and voltages V11, V12, V13 are the voltages present at nodes N11, N12, N13 respectively. The voltage booster VB provides a shunt control voltage V14, boosted with respect to the trigger output voltage V13, to drive the shunt transistor TN 1.

Figure 4:
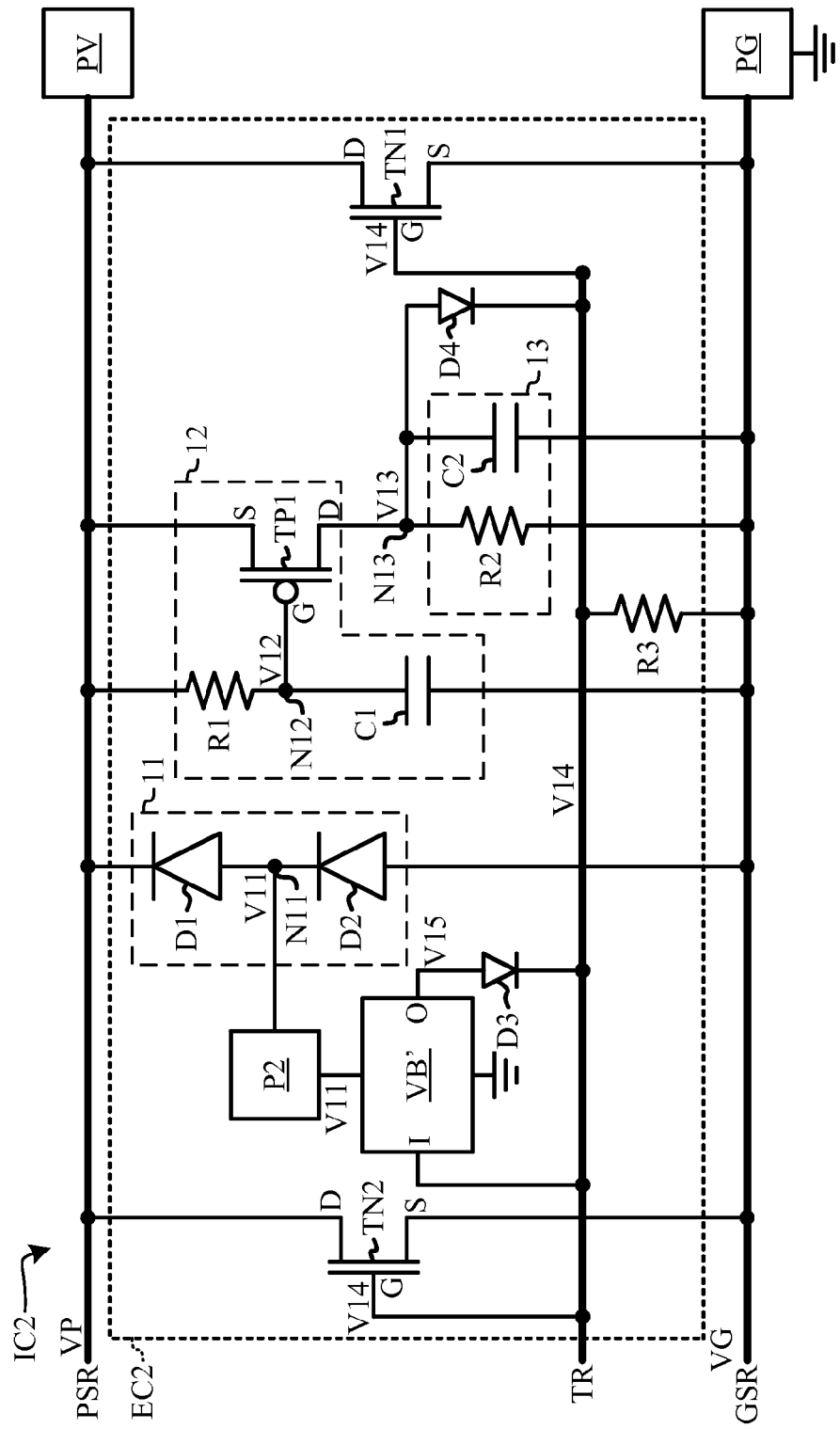
FIG. 4 shows an integrated circuit comprising an ESD protection circuit according to another embodiment.

FIG. 4 shows an integrated circuit IC2 comprising an ESD protection circuit EC2 according to another embodiment of the disclosure. Integrated circuit IC2 comprises a voltage pad PV coupled to a power supply rail PSR, a ground pad PG coupled to a ground supply rail GSR, an input/output pad P2, internal circuitry (not shown), and the ESD protection circuit EC2, both linked to the rails PSR, GSR.

As previously, the ESD protection circuit EC2 comprises the input 11, the trigger 12, the trigger output node N13, and the delay 13, which are the same as those described above in relation to FIG. 3, and will not be described again. ESD protection circuit EC2 further comprises two shunt transistors TN1, TN2, a voltage booster VB', and a trigger rail TR. Each transistor TN1, TN2 has a drain terminal D coupled to the power supply rail PSR, a source terminal S coupled to the ground supply rail GSR, and a control terminal (gate terminal G) coupled to the trigger rail TR. The trigger rail TR is coupled to node N13 and to the input I and output O of voltage booster VB'. Voltage booster VB' is a level-shifter circuit powered by the voltage applied to the pad P2.

It will be understood by the skilled person that the number and arrangement of the shunt transistors, here transistors TN1, TN2, may vary depending on the application, the layout of the integrated circuit, the MOSFET transistor size specifications, etc.

The ESD protection circuit EC2 optionally comprises diodes D3, D4 and a resistor R3, as shown in FIG. 4. Diode D3 is arranged on the output O of the booster VB', such that its cathode is coupled to the output O and its anode is linked to the trigger rail TR. Diode D4 is arranged such that its cathode is coupled to node N13, and its anode is coupled to the trigger rail TR. Resistor R3 has one terminal coupled to the ground supply rail GSR, and one terminal coupled to the trigger rail TR.

Diode D3 prevents the voltage on the trigger rail TR from influencing the voltage booster VB'. Diode D4 prevents the voltage on the trigger rail TR from reverse biasing the transistor TP1 of the trigger 12. As they are not within the electrostatic discharge path, diodes D3, D4 may be small in size. Consequently, diodes D3, D4 do not greatly affect the size of the ESD protection circuit. Finally, resistor R3 keeps the voltage on the trigger rail TR grounded during normal operation of the integrated circuit IC. Otherwise, the voltage on the trigger rail TR would be in a floating state, which could cause voltage leaks via the shunt transistors TN1, TN2.

As previously, voltage VP is the voltage present on the power supply rail PSR, voltage VG is the voltage present on the ground supply rail GSR, and voltages V11, V12, V13 are the voltages present at nodes N11, N12, N13 respectively. Voltage V14 is a shunt control voltage present on the trigger rail TR, and a voltage V15 is a voltage supplied on output O of the booster VB'.

Figure 5:
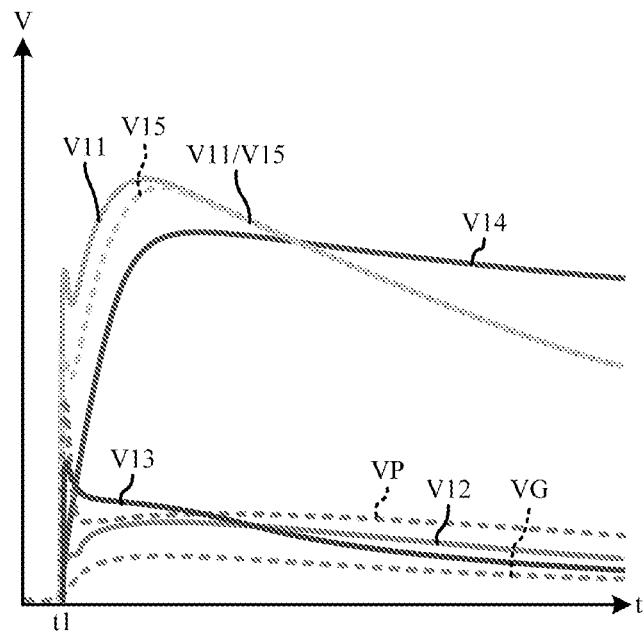
FIG. 5 shows voltages versus time at various points of the ESD protection circuit of FIG. 4.

FIG. 5 shows voltages V (VP, VG, V11, V12, V13, V14, V15) with respect to time t at various points of the ESD protection circuit EC2 according to FIG. 5 during an ESD event. At a time t1, an ESD event occurs, for example by applying test probes between pad P2 and the ground pad PG. Voltage V11 present at the pad P2 increases rapidly. Voltage VP present on the power supply rail also increases, but to a peak voltage value much less than that of voltage V11 due to the voltage drop across diode D1 and due to parasitic resistances (not shown) present in the metal supply rails. Voltage VG on the ground supply rail increases slightly, but is kept low by ground pad PG, which is connected to ground.

Voltage V12 at node N12 is initially held low, at a voltage value less than that of the power supply rail. Consequently, transistor TP1 is in a conducting state. Node N13 is thus coupled to the power supply rail PSR, and voltage V13 increases towards voltage VP.

Figure 2:
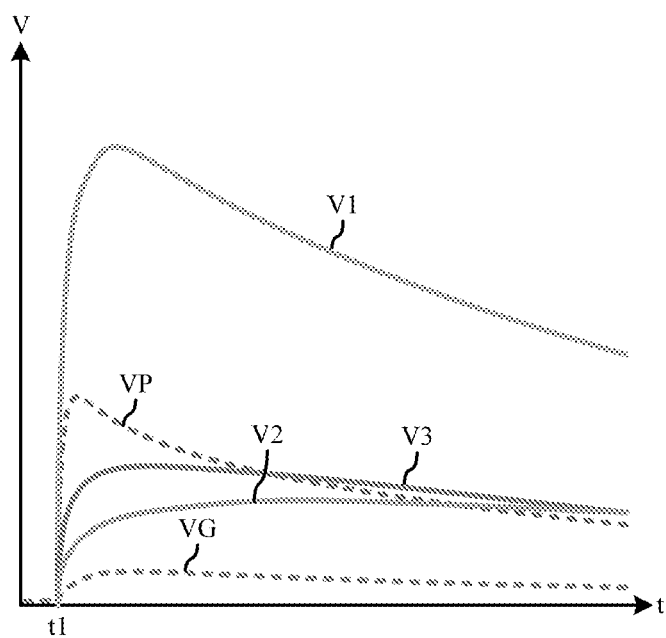

Voltage V14 on the trigger rail TR is applied to the input of the voltage booster VB', and is boosted to the value of the voltage powering the voltage booster VB', here voltage V11. Voltage V15 supplied on output of the booster VB' matches voltage V11 after a certain delay, depending on the layout and the elements of the protection circuit. Voltage V15 is applied through diode D3 to the trigger rail TR and increases voltage V14. Voltage V14 is therefore maintained at a higher voltage than that shown as voltage V3 in FIG. 2.

Voltage V14 is applied to the control terminals of the shunt transistors TN1, TN2. Transistors TN1, TN2 are set in a coupling state, coupling the supply rails GSR, PSR. The high voltage due to the ESD event is thus dissipated.

In summary, the boosted shunt control voltage V14 provides an improved ESD protection performance by an increased clamp current, and may be exploited by improving performance target margins and/or reducing the size of the shunt transistors TN1, TN2.

In FIG. 5, it may be noticed that there is a dip or "glitch" in the voltages VP, V11, V12, V13, and V15 shortly after the start of the ESD event, for example 15 nS after time t1. This glitch is due to the increasing clamp current of transistors TN1, TN2 causing an increased voltage in ESD inductance.

Furthermore, the peak of the voltage ramp of voltage V11 occurs slightly later than the peak of the voltage ramp of voltage V1. Finally, the voltage boost provided by the embodiment of FIG. 4 decreases the amount of voltage stress experienced on the input/output pad P2 with respect to ground of the integrated circuit, for example by several volts.

Figure 6:
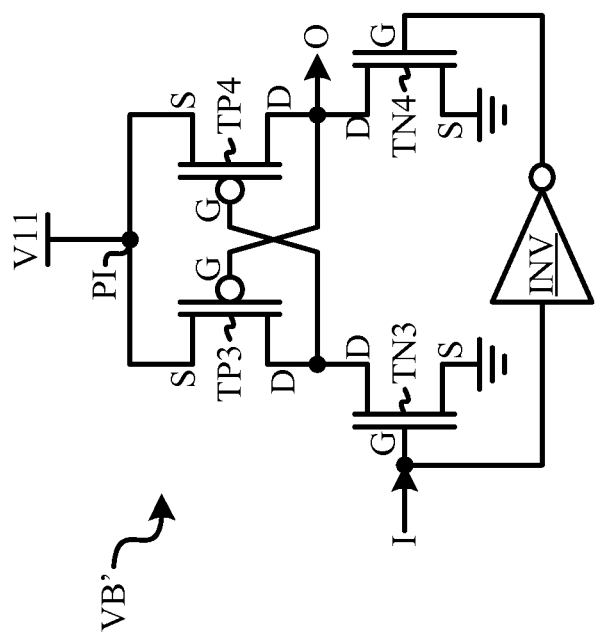
FIG. 6 is a circuit diagram of a portion of the ESD protection circuit of FIG. 4.

FIG. 6 is a circuit diagram of voltage booster VB', which is a level-shifter in the embodiment described in relation with FIG. 4. Booster VB' comprises the input I, the output O, two PMOS transistors TP3, TP4, two NMOS transistors TN3, TN4, an inverter INV, and an electrical power input PI.

The input I is coupled to the gate terminal G of transistor TN3 and to the input of the inverter INV. The output of inverter INV is coupled to the gate terminal G of transistor TN4. Transistors TN3, TN4 each have a source terminal S coupled to ground.

Transistor TN3 has a drain terminal D coupled to the drain terminal D of transistor TP3 and to the gate terminal G of transistor TP4. Transistor TN4 has a drain terminal D coupled to the drain terminal D of transistor TP4, to the gate terminal G of transistor TP3, and to the output O. Finally, Transistors TP3, TP4 each have a source terminal S coupled to the power input PI. The power input PI receives voltage V11, such that the booster VB' is electrically powered by the voltage V11, which is the voltage applied to pad P2.

When the input I is at logic 0, transistor TN3 is in the blocked state, and transistor TN4 is in the conducting state, linking the output O to ground. Transistor TP3 receives logic 0 on its gate terminal, and is set in a conducting state, coupling the voltage present on the power input to the gate terminal of transistor TP4, which is set in a blocked state, such that the output O remains at zero.

If however a logic 1 is applied to the input I, transistor TN3 is set in the conducting state, linking the gate terminal of transistor TP4 to ground, setting it in a conducting state. The output O is then set to voltage V11 (disregarding threshold voltages). On the contrary, the gate terminal of transistor TN4 receives logic 0, setting it in the blocked state, and transistor TP3 is also in the blocked state.

It is to be noted that during normal operation of integrated circuit IC2, a voltage value supplied to the pad P2 will also be supplied to the power input PI of the booster VB'. To this end, a means of disabling the voltage booster VB' during normal operation may be provided, such as a means to keep the gate terminal of transistor TN4 tied to a high voltage, keeping transistor TN4 in a conducting state, and the output O of the booster grounded.

Figure 7:
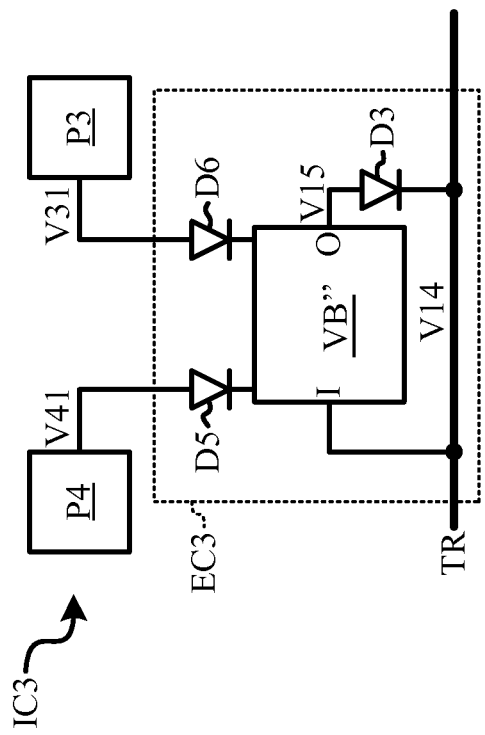
FIG. 7 shows a portion of an ESD protection circuit according to another embodiment.

FIG. 7 shows a portion of an ESD protection circuit EC3 of an integrated circuit IC3 according to another embodiment.

Circuit EC3 comprises pads P3, P4, a voltage booster VB", and diodes D5, D6. Pads P3, P4 are each coupled to the cathodes of diodes D5, D6 respectively, and supply voltages V31, V41 to power inputs of the voltage booster VB".

Figure 8:
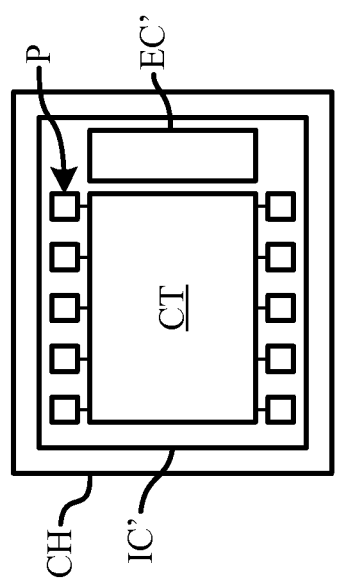
FIG. 8 shows a semiconductor chip comprising an integrated circuit with an ESD protection circuit according to an embodiment.

FIG. 8 shows a semiconductor chip CH comprising an integrated circuit IC' (IC1, IC2, IC3) with an ESD protection circuit EC' (EC1, EC2, EC3) according to an embodiment of the disclosure. The integrated circuit IC' further comprises internal circuitry CT and a plurality of pads P. Power and ground supply rails are not shown in FIG. 8.

Figure 9:
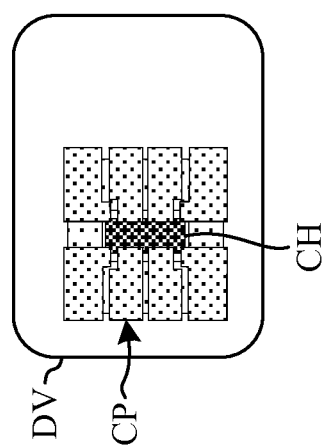
FIG. 9 shows a device comprising a semiconductor chip according to FIG. 8.

FIG. 9 shows a device DV, such as a smartcard, comprising a semiconductor chip CH and contact pads CP to make contact to pads (not shown in FIG. 9) of the chip.

It will be understood by the skilled person that the electrostatic discharge protection circuit according to the disclosed embodiments is susceptible of different configurations, particularly of the input 11, the trigger 12, and the delay 13. For example, the resistance R1 and the capacitance C1 may be switched such that the capacitor C1 has one terminal coupled to the power supply rail and the resistor R1 has one terminal coupled to the ground supply rail GSR, the transistor TP1 may be replaced by one or more inverters, the delay 13 may be removed, etc.

Furthermore, the various elements of the electrostatic discharge protection circuit, such as the input, the trigger, and the delay, may be distanced from each other, with other elements, such as pads and the internal circuitry intervening between. Finally, the inputs 11, though being described as part of the protection circuits, may alternatively be considered as part of the pad P1, P2, P3, P4, PV, PG circuitry.

Finally, the skilled person will further understand that the voltage booster may be implemented differently, for example using different configurations of NMOS and PMOS transistors, or using a circuit configuration other than a level-shifter circuit. Accordingly, the implementation of the voltage booster in an electrostatic discharge protection circuit is not limited to the level-shifter circuit shown in FIG. 6.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electrostatic discharge (ESD) protection circuit, comprising:
   a shunt having a control terminal and configured to electrically couple a power supply rail and a ground supply rail of an integrated circuit in response to receiving a boosted shunt control voltage at the control terminal;
   a first pad configured to receive an ESD voltage;
   a trigger having an output and configured to detect the ESD voltage on the first pad and output a shunt control voltage in response to detecting the ESD voltage; and
   a voltage booster arranged between the output of the trigger and the control terminal of the shunt, and configured to boost the shunt control voltage and provide the boosted shunt control voltage to the control terminal of the shunt, the voltage booster being coupled to the first pad and being configured to draw power for operation from the ESD voltage of the first pad.

2. The circuit according to claim 1, wherein the voltage booster is a level-shifter circuit configured to increase a voltage level of the shunt control voltage, the level-shifter circuit having a first power input configured to receive a first high electrostatic discharge voltage from the first pad.

3. The circuit according to claim 2, wherein the level-shifter circuit has a second power input configured to receive a second high electrostatic discharge voltage from a second pad, the circuit comprising:
   a first diode arranged between the first power input of the level-shifter circuit and the first pad; and
   a second diode arranged between the second power input of the level-shifter circuit and the second pad.

4. The circuit according to claim 1, further comprising a diode arranged between an output of the voltage booster and the control terminal of the shunt.

5. The circuit according to claim 1, further comprising a diode arranged between the output of the trigger and an input of the voltage booster.

6. The circuit according to claim 1, further comprising a resistor with one terminal coupled to the ground supply rail and one terminal coupled to the control terminal of the shunt.

7. A method of protecting an integrated circuit from an electrostatic discharge event, comprising:
   receiving a high voltage;
   detecting that the high voltage is an electrostatic discharge event voltage;
   providing a shunt control voltage in response to detecting that the high voltage is an electrostatic discharge (ESD) voltage;
   powering a voltage booster with the ESD voltag:
   boosting the shunt control voltage to a boosted shunt control voltage via the voltage booster while the voltage booster is powered by the ESD voltage; and
   discharging the ESD voltage by triggering a shunt device, coupled between a power supply rail and a ground supply rail of the integrated circuit, in response to the boosted shunt control voltage.

8. The method according to claim 7, comprising transmitting the boosted shunt control voltage through a diode to a control terminal of the shunt control device.

9. The method according to claim 7, comprising transmitting the shunt control voltage through a diode to the voltage booster that boosts the shunt control voltage to the boosted shunt control voltage.

10. The method according to claim 7, wherein the boosting is performed by the voltage booster having first and second power inputs, the method comprising
   receiving, at the first power input and through a first diode, a first high electrostatic discharge voltage from a first power input terminal; and
   receiving, at the second power input and through a second diode, a second high electrostatic discharge voltage from a second power input terminal.

11. A device, comprising:
   a semiconductor substrate;
   a shunt formed on the semiconductor substrate and including a control terminal, the shunt being configured to electrically couple a power supply rail and a ground supply rail of the integrated circuit in response to receiving a boosted shunt triggering voltage at the control terminal;
   a trigger circuit formed on the semiconductor substrate and having an output, the trigger circuit being configured to provide a shunt triggering voltage at the output in response to detecting a voltage between terminals of the integrated circuit that exceeds a threshold; and
   a booster circuit formed on the semiconductor substrate, coupled between the output of the trigger circuit and the control terminal of the shunt, and configured to generate the boosted shunt triggering voltage by boosting the shunt triggering voltage, wherein the booster circuit is configured to draw power for operation from the detected voltage.

12. The device of claim 11, wherein the shunt comprises a transistor coupled between the power supply rail and the ground supply rail.

13. The device of claim 11, wherein the voltage booster has a first power input configured to receive a first high electrostatic discharge voltage from a first power input terminal and a second power input configured to receive a second high electrostatic discharge voltage from a second power input terminal, the device comprising:
 a first diode arranged between the first power input of the level-shifter circuit and first power input terminal; and
 a second diode arranged between the second power input of the level-shifter circuit and second power input terminal.

14. The device of claim 11, further comprising a diode arranged between an output of the voltage booster and the control terminal of the shunt.

15. The device of claim 11, further comprising a diode arranged between the output of the trigger and an input of the voltage booster.

16. The device of claim 11, comprising internal circuitry formed on the semiconductor substrate, wherein the shunt is configured to protect the internal circuitry from an electrostatic discharge event.

* * * * *